`US009882349B1`

(12) United States Patent
Krishnamoorthy et al.

(10) Patent No.: US 9,882,349 B1
(45) Date of Patent: Jan. 30, 2018

(54) EXTERNALLY REFERENCED WAVELENGTH-LOCKING TECHNIQUE FOR HYBRID LASERS

(71) Applicant: Oracle International Corporation, Redwood Shores, CA (US)

(72) Inventors: Ashok V. Krishnamoorthy, San Diego, CA (US); Jin-Hyoung Lee, San Diego, CA (US); Xuezhe Zheng, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/404,437

(22) Filed: Jan. 12, 2017

(51) Int. Cl.
  *H01S 5/068* (2006.01)
  *H01S 5/0687* (2006.01)
  *H01S 5/06* (2006.01)
  *H01S 5/125* (2006.01)
  *H01S 5/30* (2006.01)

(52) U.S. Cl.
  CPC ............ *H01S 5/068* (2013.01); *H01S 5/0601* (2013.01); *H01S 5/0617* (2013.01); *H01S 5/0687* (2013.01); *H01S 5/125* (2013.01); *H01S 5/3013* (2013.01)

(58) Field of Classification Search
  CPC ...... H01S 5/068; H01S 5/0617; H01S 5/3013; H01S 5/0601; H01S 5/0687
  See application file for complete search history.

(56) References Cited

U.S. PATENT DOCUMENTS

| 4,993,032 | A | 2/1991 | Bradley |
| 5,043,991 | A | 8/1991 | Bradley |
| 6,341,138 | B1 | 1/2002 | Peters |
| 2005/0018741 | A1 | 1/2005 | Nomaguchi |
| 2015/0109661 | A1* | 4/2015 | Li ................. G02B 6/29331 359/341.4 |
| 2017/0139237 | A1* | 5/2017 | Luo ................. G02F 1/011 |

OTHER PUBLICATIONS

Bovington et al.; "III-V/Si Tunable Vernier-Ring Flexible Grid Comb Laser," Conf. on Lasers and Electro-Optics (CLEO-'16), post-deadline paper (PDP), pp. 1-2, San Jose, Jun. 2016.
Akiyama et al.; "A novel transmitter leveraging high-speed ultralow-power modulation of a Si microring modulator by eliminating tuning power," OFC 2016, M2C.4, 2016.
(Continued)

*Primary Examiner* — Dung Nguyen
(74) *Attorney, Agent, or Firm* — Park, Vaughan, Fleming & Dowler LLP

(57) ABSTRACT

The disclosed embodiments relate to a system that locks a wavelength of a hybrid laser to a wavelength of a reference laser, wherein a lasing cavity of the hybrid laser includes a reflective gain medium (RGM) comprising an optical gain material coupled with an associated reflector, a phase tuner, a laser ring filter and a silicon mirror. During operation, while the hybrid laser is turned off, the system tunes a reference ring filter to the wavelength of the reference laser. Next, the system turns on the hybrid laser. The system then tunes the laser ring filter in the hybrid laser to the reference ring filter. Finally, the system adjusts the phase tuner in the hybrid laser to align a lasing cavity mode of the hybrid laser with the tuned laser ring filter.

20 Claims, 6 Drawing Sheets

(56) References Cited

OTHER PUBLICATIONS

Lee et al.; "Demonstration of 12.2% wall plug efficiency in uncooled single mode external-cavity tunable Si/III-V hybrid laser," Optics Express, vol. 23, No. 9, pp. 12079-12088, May 2015.
Bosc et al.; Temperature and polarisation insensitive Bragg gratings realised on silica waveguide on silicon, Electronics Letters, vol. 33, No. 2, Jan. 1997.
Liu et al.; "Condition for the realization of a temperature-insensitive long-period waveguide grating", Optics Letters, vol. 31, pp. 2716-2718, No. 18, Sep. 15, 2006.

\* cited by examiner

EXTERNALLY REFERENCED WAVELENGTH-LOCKING TECHNIQUE FOR HYBRID LASERS

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to wavelength-locking techniques for lasers. More specifically, the disclosed embodiments relate to a technique for monitoring and controlling local ring filters and/or modulators for hybrid lasers based on a global wavelength reference.

RELATED ART

Silicon photonics is a promising new technology that can potentially provide large communication bandwidth, low latency and low power consumption for inter-chip and intra-chip connections. In particular, wavelength-division multiplexing (WDM) silicon-photonic link technology provides a promising new solution to the problem of interconnecting future high-performance processors and computing systems. The use of WDM enables silicon photonics to differentiate itself from other optical link technologies, such as vertical-cavity surface-emitting laser (VCSEL)-based parallel optics. However, it also complicates the optical link substantially. For example, FIG. 1A presents a block diagram of a conventional WDM transmitter 100, comprising three major components, including: (1) continuous wave (CW) WDM laser sources 111-114 having different wavelengths and fixed wavelength spacings; (2) electro-optical (EO) modulators 121-124, which modulate the CW WDM carrier wavelengths to convert the electrical data into modulated optical signals; and (3) an optical wavelength WDM multiplexer 130 that combines all of the modulated wavelength channels into one waveguide to produce a WDM transmitter output.

Silicon photonics can also be used to create hybrid single-wavelength lasers and multi-wavelength comb-lasers that act as laser sources for silicon-based high-speed modulators. For example, by using a comb laser source 160 and cascaded ring modulators 170, a simple WDM transmitter 150 with a reduced number of components can be constructed as is illustrated in FIG. 1B. Note that comb laser source 160 can be fabricated with accurate, tunable channel spacing by using hybrid integration of a III-V array gain chip with a cascaded Vernier ring circuit. (See J. Bovington, X. Zheng, S. S. Djordjevic, J.-H. Lee, I. Shubin, Y. Luo, S. Lin, D. Y. Lee, Jin Yao, J. E. Cunningham, K. Raj, and A. V. Krishnamoorthy, "III-V/Si Tunable Vernier-Ring Flexible Grid Comb Laser," Conf. on Lasers and Electro-Optics (CLEO-'16), post-deadline paper (PDP), pp. 1-2, San Jose, June 2016.) In such a simplified WDM transmitter 150, the wavelength multiplexer becomes part of the laser source, which means there is one less WDM device to tune and control. However, the rings in the comb laser source 160 still need to be tuned and controlled for alignment with desired cavity modes, and the cascaded ring modulators 170 still need to be tuned and controlled to facilitate wavelength alignment with the laser wavelengths from the comb source.

It is also possible to combine the micro-resonator mirror and the micro-ring modulator into a single device that serves both purposes. This can be accomplished by using a single micro-ring modulator (MRM) that also serves as a ring filter as is illustrated by optical transmitter 200 that appears in FIG. 2. (See Tomoyuki Akiyama, Shinsuke Tanaka, Teruo Kurahashi, Hiroji Ebe, and Shigeaki Sekiguchi, "A novel transmitter leveraging high-speed ultralow-power modulation of a Si microring modulator by eliminating tuning power," OFC 2016, M2C.4, 2016.)

However, a number of complications must be addressed to effectively implement a WDM system. To enable WDM links to work in concert with the WDM transmitter described above, the wavelength channels of the WDM components need to be aligned and locked to a common grid. Moreover, in a general-purpose WDM system, each transmitting wavelength must be acquired and maintained (or locked) within a specified range to ensure correct operation of downstream components. Also, because the operational wavelengths of silicon devices on a semiconductor chip are subject to fabrication uncertainties and ambient temperature changes, ongoing wavelength tuning and control is required.

A further complication is the method of establishing a wavelength reference. If a local wavelength reference is used, it must be accurate during temperature fluctuations, which is notoriously difficult to accomplish with semiconductor technologies. Note that the advantages of using efficient, tunable ring-resonator-based silicon mirrors to build hybrid laser sources have been investigated. (See J.-H. Lee, J. Bovington, I. Shubin, Y. Luo, S. Lin, J. E. Cunningham, K. Raj, A. V. Krishnamoorthy, X. Zheng, "Demonstration of 12.2% wall plug efficiency in uncooled single mode external-cavity tunable Si/III-V hybrid laser," Optics Express, Vol. 23, No. 9, pp. 12079-12088, May 2015.). However, techniques for setting the tuning reference point for each laser, and hence the specific wavelengths of the comb, have yet to be developed. Thus, when operating arrays of such modulators and multiplexers, issues related to wavelength tuning and control can make the WDM transmitter very complex and power hungry.

Hence, what is needed is an effective technique for tuning the lasers to a global reference wavelength.

SUMMARY

The disclosed embodiments relate to a system that locks a wavelength of a hybrid laser to a wavelength of a reference laser, wherein a lasing cavity of the hybrid laser includes a reflective gain medium (RGM) comprising an optical gain material coupled with an associated reflector, a phase tuner, a laser ring filter and a silicon mirror. During operation, while the hybrid laser is turned off, the system tunes a reference ring filter to the wavelength of the reference laser. Next, the system turns on the hybrid laser. The system then tunes the laser ring filter in the hybrid laser to the reference ring filter. Finally, the system adjusts the phase tuner in the hybrid laser to align a lasing cavity mode of the hybrid laser with the tuned laser ring filter.

In some embodiments, the hybrid laser is part of an optical transmitter, and the reference ring filter comprises a ring modulator that modulates an optical signal based on an electrical input signal to produce an output for the optical transmitter.

In some embodiments, the system periodically performs a continuous-calibration operation. During this continuous-calibration operation, the system turns on the reference laser and measures a first alignment between the reference laser and the reference ring filter. Next, the system turns off the reference laser and adjusts a wavelength of the reference laser in an adjustment direction. The system then turns on the reference laser and measures a second alignment between the reference laser and the reference ring filter. If the second alignment is closer than the first alignment, the system uses the alignment direction in a subsequent continuous-calibration operation. On the other hand, if the second alignment is not closer than the first alignment, the system changes the adjustment direction for subsequent continuous-calibration operations.

In some embodiments, the silicon mirror comprises a loop mirror.

In some embodiments, the silicon mirror comprises a distributed Bragg reflector (DBR).

In some embodiments, the silicon mirror is a tunable silicon mirror, which includes a thermal-tuning mechanism.

In some embodiments, the hybrid laser further comprises a tuning waveguide that taps light from the silicon mirror and couples the tapped light to the reference ring filter to facilitate tuning the laser ring filter to the reference ring filter.

In some embodiments, the reference ring filter and the laser ring filter have different radii, which creates a Vernier effect that facilitates tuning the laser ring filter to the reference ring filter.

In some embodiments, the RGM is located on a gain chip that is separate from a silicon photonic chip, which includes the phase tuner, the laser ring filter and the silicon mirror.

In some embodiments, the optical gain material comprises a III-V semiconductor.

DETAILED DESCRIPTION

Figure 1A:
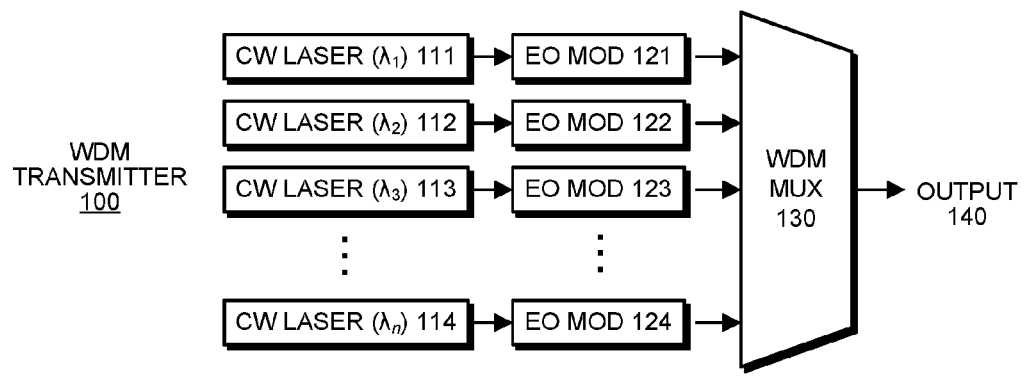
FIG. 1A illustrates a WDM transmitter in accordance with the disclosed embodiments.
Figure 1B:
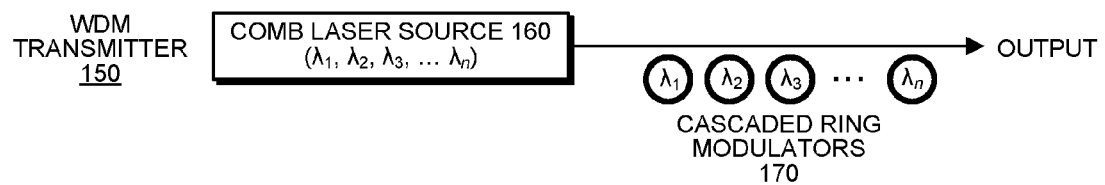
FIG. 1B illustrates another WDM transmitter in accordance with the disclosed embodiments.
Figure 2:
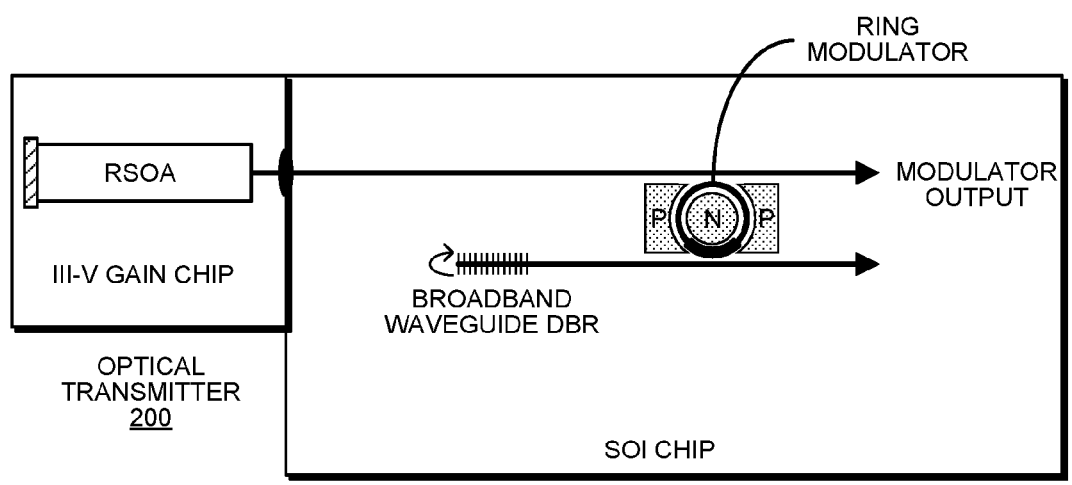
FIG. 2 illustrates an optical transmitter in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Throughout this specification, and in the appended claims, we use the term "gain medium" (GM) to refer to any device, which contains active gain material and can be used to power a laser. This can include, but is not limited to: a semiconductor optical amplifier (SOA), an active device fabricated using a quantum-dot gain material, and an active device fabricated in a nonlinear fiber gain medium.

We also use the term "reflective gain medium" (RGM) to refer to any type of active gain material, which is coupled to an associated reflector. This can include, but is not limited to: a reflective semiconductor optical amplifier (RSOA), and an SOA that can be accessed through both ends and looped either as: (1) a loop mirror coupled to a reflective end of the SOA, or (2) a loop containing the SOA before the SOA. (This geometry changes the structure to the extent that light passes in a single pass through both directions in the SOA, just like a double pass through an RSOA, and provides gain.) Note that the loop mirror recited above can alternatively be replaced with a distributed Bragg reflector (DBR).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The disclosed embodiments provide a technique for locking a wavelength of hybrid laser to a wavelength of an external reference laser. In this way, the reference laser can provide a single global wavelength reference (or multiple wavelength references for a comb source), which can be distributed to multiple local hybrid lasers akin to a global clock. This enables all of the local hybrid lasers to be tuned to this global wavelength reference, which facilitates calibrating and locking the individual local hybrid lasers as required. Furthermore, this external reference laser does not have to provide the optical power to the links, so that it can be turned off when it is not being used. The reference laser can also be used as a spare laser, in case one or more of the local hybrid lasers fails.

Details

Figure 3:
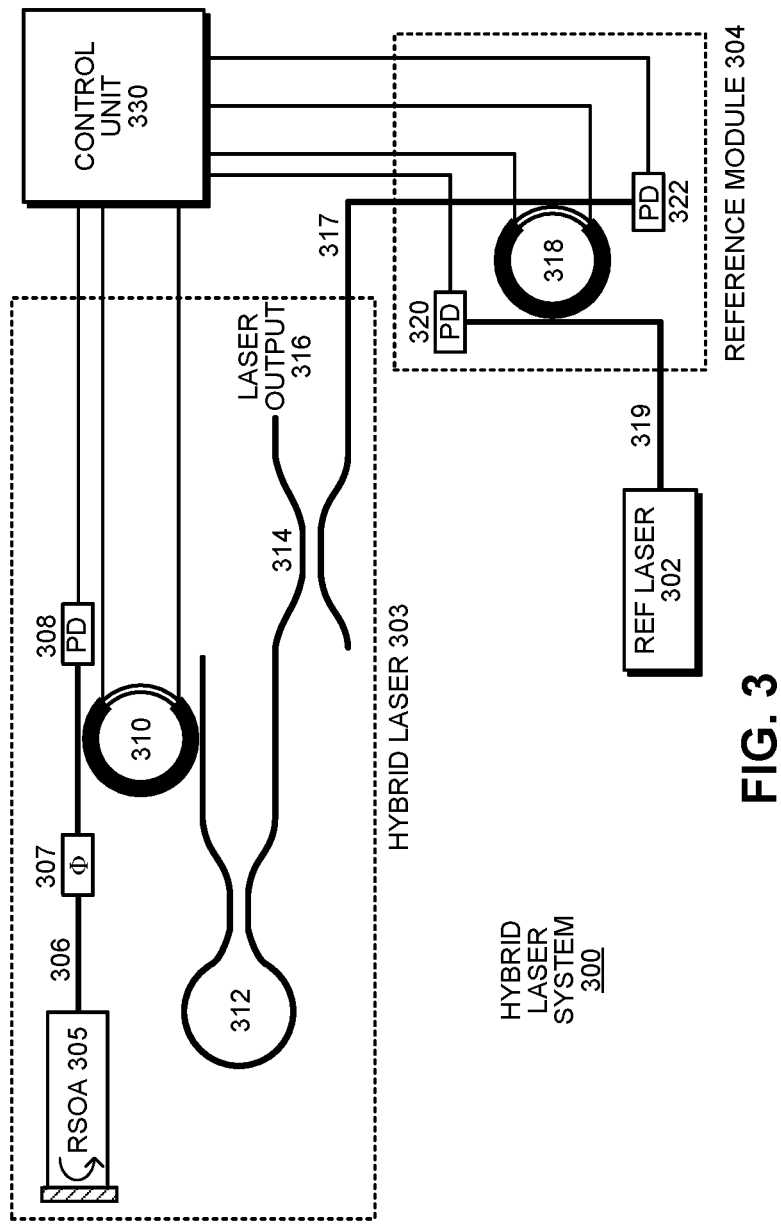
FIG. 3 illustrates a hybrid laser that includes a reference filter for a reference laser in accordance with the disclosed embodiments.

Hybrid laser system 300, which is illustrated in FIG. 3, demonstrates the basic concept of the invention. Hybrid laser system 300 includes a hybrid laser 303 and a reference module 304, which captures a reference from an external reference laser 302. More specifically, hybrid laser 303 comprises an RSOA 305, which is optically coupled to a laser ring filter 310 through a waveguide 306, wherein waveguide 306 includes an intervening phase tuner 307 and a photodetector (PD) 308. Laser ring filter 310 is itself optically coupled to a loop mirror 312, wherein a distal end of loop mirror 312 produces a laser output 316. Laser output 316 also feeds through a coupler 314, which optically couples laser output 316 to a tuning waveguide 317. Tuning waveguide 317 is optically coupled to reference ring filter 318 and PD 322 within reference module 304. Reference ring filter 318 is also optically coupled to a reference waveguide 319, which is optically coupled to reference laser 302 and PD 320. Note that various components within hybrid laser 303 and reference module 304 are coupled to a control unit 330, which controls the operation of hybrid laser system 300.

During operation of hybrid laser system 300, reference ring filter 318 is tuned to reference laser 302. Next, reference ring filter 318 is subsequently used to tune laser ring filter 310. Note that during this process, no absolute wavelength information is required on chip. Moreover, in some embodiments, reference ring filter 318 and laser ring filter 310 have different radii, which creates a Vernier effect that facilitates tuning the laser ring filter to the reference ring filter.

This tuning process operates as follows. During an initial calibration operation, while hybrid laser 303 is turned off, reference laser 302 is turned on and reference ring filter 318 is tuned to minimize power on PD 320 (or to maximize power on PD 322); this aligns reference ring filter 318 with reference laser 302. Next, while tuning power is maintained on reference ring filter 318, reference laser 302 is turned off, and hybrid laser 303 is turned on. Laser ring filter 310 is then tuned to minimize power on PD 322 (or to maximize power on PD 320), which aligns laser ring filter 310 with reference ring filter 318. Note that PD 322 is connected to the "through port" of reference ring filter 318, and PD 320 is connected to the "drop port" of reference ring filter 318. Hence, when reference ring filter 318 is "on resonance," power on the through port is maximized while power on the drop port is minimized. Note that the through and drop ports are swapped for laser ring filter 310. Also note that for each tuning adjustment of laser ring filter 310, phase tuner 307 is adjusted to minimize power on PD 308. This phase-tuning operation is needed to align a lasing cavity mode of the hybrid laser 303 with tuned laser ring filter 310.

Next, the system periodically performs continuous-calibration operations while hybrid laser 303 remains turned on, wherein each continuous-calibration operation operates as follows. First, reference laser 302 is turned on and a first reading is recorded from PD 320. Then, reference laser 302 is turned off and laser ring filter 310 is adjusted in an arbitrary "adjustment direction." Next, laser ring filter 310 is tuned to minimize power on PD 322 (or to maximize power on PD 320), which aligns laser ring filter 310 with reference ring filter 318, and phase tuner 307 is adjusted to minimize power on PD 308 to align a lasing cavity mode of the hybrid laser 303 with tuned laser ring filter 310. Then, reference laser 302 is turned on and a second reading is recorded from PD 320. If this second reading is smaller than the first reading, this indicates the adjustment direction is correct, and the adjustment direction remains the same for subsequent continuous-calibration operations. Otherwise, if the reading is the same or larger, then the adjustment direction is changed for subsequent continuous-calibration operations.

By repeating the above-described continuous-calibration operation, the system effectively implements a bang-bang controller. This bang-bang controller performs a hill-climbing procedure that seeks to increase an objective function, which is based on minimizing the power on PD 320. When the system hits the peak of the objective function, the system dithers around the peak. However, note that if the system is on a flat part of the response curve, the system needs to keep adjusting the tuning until some change occurs. Note that for this bang-bang controller to operate effectively, the tuning range has to be sufficiently large, which is why having different-sized ring filters that create a Vernier effect can be useful.

Note that the initial calibration operation is performed while the hybrid laser is non-operational and may detune the optimum alignment of the lasing cavity mode to the hybrid laser ring filter peak. Hence, the phase tuner is needed to re-establish an optimum alignment of a specific lasing cavity mode to the laser ring filter. This will ensure that the laser is operating at its optimum operating point and that no mode-hopping occurs. Also note that both ring filters 310 and 318 may drift with temperature. Hence, it is necessary to periodically perform the continuous-calibration operation to maintain alignment with the reference laser as temperature drifts. Finally, note that the seed of the reference laser modulation can be slow, depending only on the rate of change of temperature or detuning of the rings, and not on the data rate of the optical link. After alignment is achieved, because both ring filters will drift approximately equally (particularly if they are similarly sized and in close proximity), the system will converge during the continuous-calibration operation, and the hybrid laser will not need to be turned off.

Figure 4:
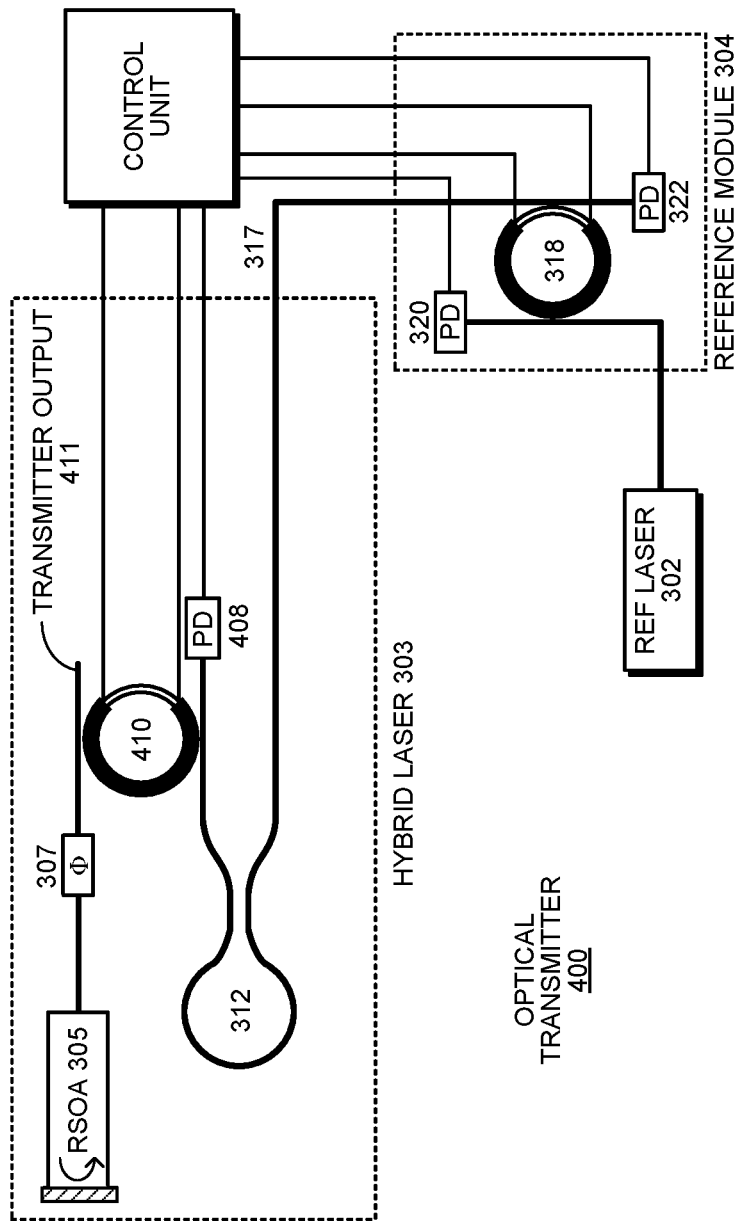
FIG. 4 illustrates a ring-modulated laser (RML) that includes a reference filter for a reference laser in accordance with the disclosed embodiments.

FIG. 4 illustrates another embodiment of the present invention, which implements an optical transmitter 400 in the form of an intra-cavity ring modulated laser (RML). The embodiment illustrated in FIG. 4 is similar to the embodiment illustrated in FIG. 3, except that the laser ring filter 310 is replaced with a ring modulator 410, which modulates an optical signal based on an electrical input signal to produce an output 411 for optical transmitter 400. Also, PD 308 is replaced with transmitter output 411, and the distal end of loop mirror 312 is not used as laser output 316, but instead is directly coupled to tuning waveguide 317, which is optically coupled to reference ring filter 318. Like the embodiment illustrated in FIG. 3, a small amount of light is tapped from the loop mirror 312 (which could alternatively be replaced by a Bragg mirror) and is coupled to the reference ring filter 318 through tuning waveguide 317.

The tuning process for the embodiment illustrated in FIG. 4 operates similarly to the tuning process for the embodiment illustrated in FIG. 3. During an initial calibration operation, while hybrid laser 303 is turned off, reference laser 302 is turned on, and reference ring filter 318 is tuned to minimize power on PD 320 (or to maximize power on PD 322). This aligns reference ring filter 318 with reference laser 302. Next, reference laser 302 is turned off, hybrid laser 303 is turned on, and tuning and power is maintained on reference ring filter 318. Ring modulator 410 is then tuned to minimize power on PD 322 (or to maximize power on PD 320), which aligns ring modulator 410 with reference ring filter 318. Also, for each tuning adjustment of ring modulator 410, phase tuner 307 is adjusted to minimize power on PD 308, which aligns a lasing cavity mode of the hybrid laser 303 with the tuned ring modulator 410.

Next, the system periodically performs a continuous-calibration operation while hybrid laser 303 remains turned on, wherein each continuous-calibration operation operates as follows. First, reference laser 302 is turned on and a first reading is recorded from PD 320. Then, reference laser 302 is turned off and ring modulator 410 is adjusted in an arbitrary "adjustment direction." Next, ring modulator 410 is tuned to minimize power on PD 322 (or to maximize power on PD 320), which aligns ring modulator 410 with reference ring filter 318. Also, phase tuner 307 is adjusted to minimize power on PD 308 to align a lasing cavity mode of the hybrid laser 303 with tuned ring modulator 410. Then, reference laser 302 is turned on and a second reading is recorded from PD 320. If this second reading is smaller than the first reading, this indicates that the adjust direction is correct. In this case, the adjustment direction remains the same for subsequent continuous-calibration operations. Otherwise, if the reading is the same or larger, the adjustment direction is changed for subsequent continuous-calibration operations.

Operation

Figure 5:
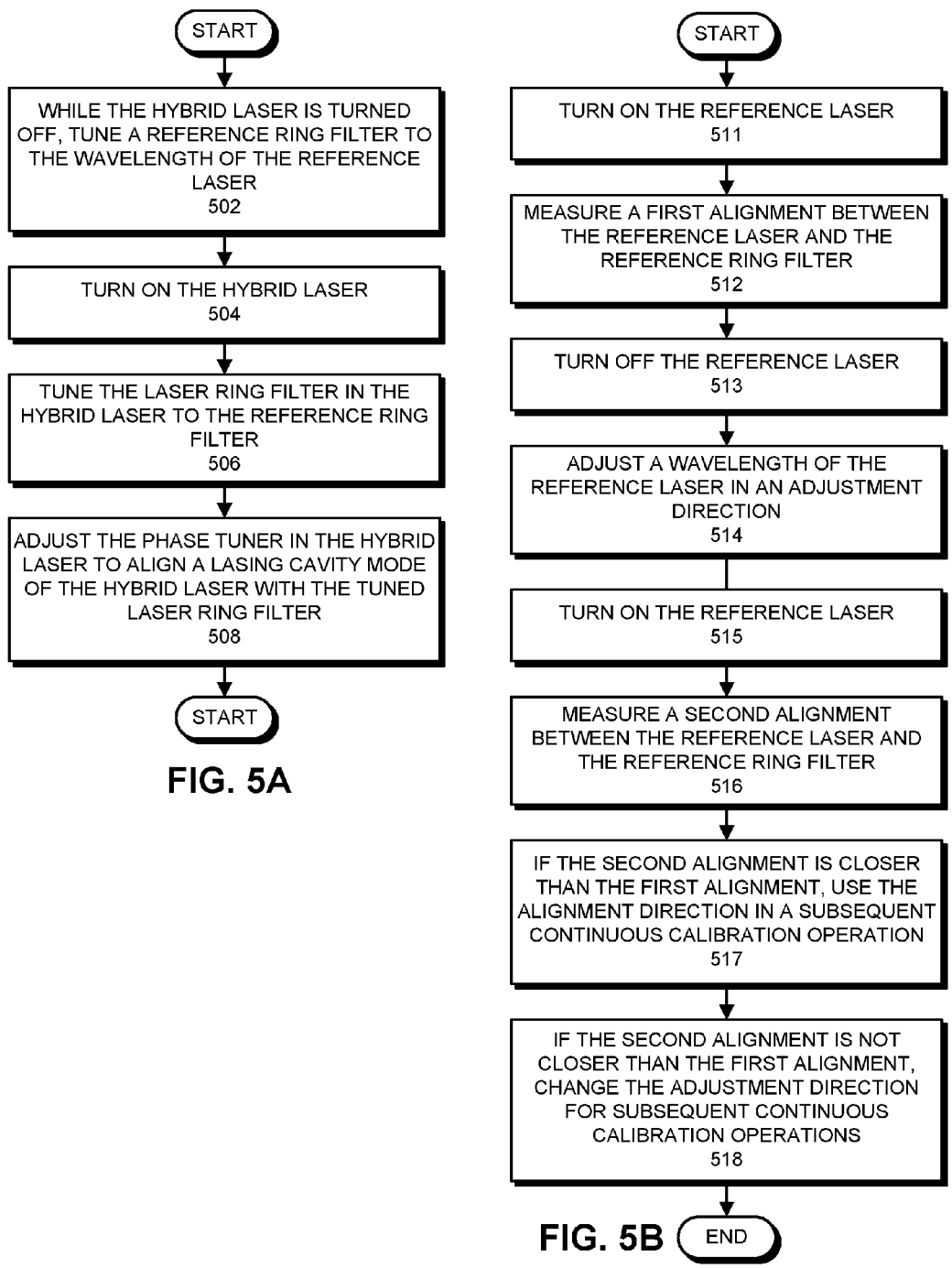
FIG. 5A presents a flow chart illustrating the process of locking a wavelength of a hybrid laser to a wavelength of a reference laser in accordance with the disclosed embodiments.
FIG. 5B presents a flow chart illustrating the process of performing a continuous-calibration operation in accordance with the disclosed embodiments.

FIG. 5A presents a flow chart illustrating (at a high level) the process of locking a wavelength of a hybrid laser to a wavelength of a reference laser in accordance with the disclosed embodiments. While the hybrid laser is turned off, the system tunes a reference ring filter to the wavelength of the reference laser (step 502). Next, the system turns on the hybrid laser (step 504). The system then tunes the laser ring filter in the hybrid laser to the reference ring filter (step 506). Finally, the system adjusts the phase tuner in the hybrid laser to align a lasing cavity mode of the hybrid laser with the tuned laser ring filter (step 508).

FIG. 5B presents a flow chart illustrating the process of performing a continuous-calibration operation in accordance with the disclosed embodiments. During this continuous-calibration operation, the system turns on the reference laser (step 511) and measures a first alignment between the reference laser and the reference ring filter (step 512). Next, the system turns off the reference laser (step 513), and adjusts a wavelength of the reference laser in an adjustment direction (step 514). The system then turns on the reference laser (step 515) and measures a second alignment between the reference laser and the reference ring filter (step 516). If the second alignment is closer than the first alignment, the system uses the alignment direction in a subsequent continuous-calibration operation (step 517). On the other hand, if the second alignment is not closer than the first alignment, the system changes the adjustment direction for subsequent continuous-calibration operations (step 518).

System

Figure 6:
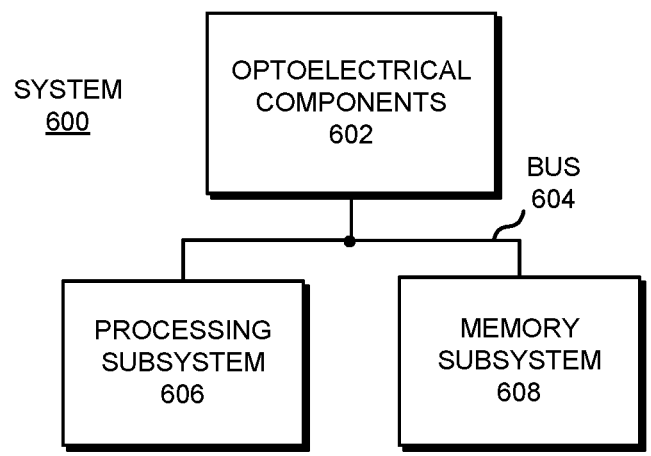
FIG. 6 illustrates a system that incorporates optical components with semiconductor chips in accordance with an embodiment of the present disclosure.

One or more of the preceding embodiments of the wavelength-locking technique may be included in a system or device. More specifically, FIG. 6 illustrates a system 600 that includes optoelectrical components 602 including one or more hybrid lasers. System 600 also includes a processing subsystem 606 (with one or more processors) and a memory subsystem 608 (with memory).

In general, system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, the optoelectrical components 602 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for locking a wavelength of a hybrid laser to a wavelength of a reference laser, comprising:
   while the hybrid laser is turned off, tuning a reference ring filter to the wavelength of the reference laser;
   turning on the hybrid laser, wherein a lasing cavity of the hybrid laser includes a reflective gain medium (RGM) comprising an optical gain material coupled with an associated reflector, a phase tuner, a laser ring filter and a silicon mirror;
   tuning the laser ring filter in the hybrid laser to the reference ring filter; and
   adjusting the phase tuner in the hybrid laser to align a lasing cavity mode of the hybrid laser with the tuned laser ring filter.

2. The method of claim 1,
   wherein the hybrid laser is part of an optical transmitter; and
   wherein the reference ring filter comprises a ring modulator that modulates an optical signal based on an electrical input signal to produce an output for the optical transmitter.

3. The method of claim 1, wherein the method further comprises periodically performing a continuous-calibration operation, which comprises:
   turning on the reference laser;
   measuring a first alignment between the reference laser and the reference ring filter;
   turning off the reference laser;
   adjusting a wavelength of the reference laser in an adjustment direction;
   turning on the reference laser;
   measuring a second alignment between the reference laser and the reference ring filter;
   if the second alignment is closer than the first alignment, using the alignment direction in a subsequent continuous-calibration operation; and
   if the second alignment is not closer than the first alignment, changing the adjustment direction for subsequent continuous-calibration operations.

4. The method of claim 1, wherein the silicon mirror comprises a loop mirror.

5. The athermal laser of claim 1, wherein the silicon mirror comprises a distributed Bragg reflector (DBR).

6. The method of claim 1, wherein the silicon mirror is a tunable silicon mirror, which includes a thermal-tuning mechanism.

7. The method of claim 1, wherein the hybrid laser further comprises a tuning waveguide that taps light from the silicon mirror and couples the tapped light to the reference ring filter to facilitate tuning the laser ring filter to the reference ring filter.

8. The method of claim 1, wherein the reference ring filter and the laser ring filter have different radii, which creates a Vernier effect that facilitates tuning the laser ring filter to the reference ring filter.

9. The method of claim 1, wherein the RGM is located on a gain chip that is separate from a silicon photonic chip, which includes the phase tuner, the laser ring filter and the silicon mirror.

10. The method of claim 1, wherein the optical gain material comprises a III-V semiconductor.

11. A hybrid laser, comprising:
   a reflective gain medium (RGM) comprising an optical gain material coupled with an associated reflector;
   a phase tuner coupled to an output of the RGM;
   a laser ring filter coupled to an output of the phase tuner;
   a silicon mirror optically coupled to the laser ring filter;
   wherein the RGM, the phase tuner, the laser ring filter and the silicon mirror collectively form a lasing cavity for the hybrid laser;
   a reference ring filter optically coupled to a reference laser and to the laser ring filter; and
   a controller that controls the hybrid laser to lock a wavelength of the hybrid laser to a wavelength of the reference laser by performing the following operations,
      while the hybrid laser is turned off, tuning the reference ring filter to the wavelength of the reference laser;
      turning on the hybrid laser;
      tuning the laser ring filter to the reference ring filter; and
      adjusting the phase tuner to align a lasing cavity mode of the hybrid laser with the tuned laser ring filter.

12. The hybrid laser of claim 11,
   wherein the hybrid laser is part of an optical transmitter; and
   wherein the reference ring filter comprises a ring modulator that modulates an optical signal based on an electrical input signal to produce an output for the optical transmitter.

13. The hybrid laser of claim 11, wherein the controller additionally controls the hybrid laser to periodically perform a continuous-calibration operation, which comprises:
   turning on the reference laser;
   measuring a first alignment between the reference laser and the reference ring filter;
   turning off the reference laser;
   adjusting a wavelength of the reference laser in an adjustment direction;
   turning on the reference laser;
   measuring a second alignment between the reference laser and the reference ring filter;
   if the second alignment is closer than the first alignment, using the alignment direction in a subsequent continuous-calibration operation; and
   if the second alignment is not closer than the first alignment, changing the adjustment direction for subsequent continuous-calibration operations.

14. The hybrid laser of claim 11, wherein the silicon mirror comprises a loop mirror.

15. The athermal laser of claim 11, wherein the silicon mirror comprises a distributed Bragg reflector (DBR).

16. The hybrid laser of claim 11, wherein the silicon mirror is a tunable silicon mirror, which includes a thermal-tuning mechanism.

17. The hybrid laser of claim 11, wherein the hybrid laser further comprises a tuning waveguide that taps light from the silicon mirror and couples the tapped light to the reference ring filter to facilitate tuning the laser ring filter to the reference ring filter.

18. The hybrid laser of claim 11, wherein the reference ring filter and the laser ring filter have different radii, which creates a Vernier effect that facilitates tuning the laser ring filter to the reference ring filter.

19. The hybrid laser of claim 11, wherein the RGM is located on a gain chip that is separate from a silicon photonic chip, which includes the phase tuner, the laser ring filter and the silicon mirror.

20. A system, comprising:
- at least one processor;
- at least one memory coupled to the at least one processor; and
- a laser source for communicating optical signals generated by the system, wherein the laser source includes:
  - a reflective gain medium (RGM) comprising an optical gain material coupled with an associated reflector;
  - a phase tuner coupled to an output of the RGM;
  - a laser ring filter coupled to an output of the phase tuner;
  - a silicon mirror optically coupled to the laser ring filter;
  - wherein the RGM, the phase tuner, the laser ring filter and the silicon mirror collectively form a lasing cavity for the hybrid laser;
  - a reference ring filter optically coupled to a reference laser and to the laser ring filter; and
  - a controller that controls the hybrid laser to lock a wavelength of the hybrid laser to a wavelength of the reference laser by performing the following operations,
    - while the hybrid laser is turned off, tuning the reference ring filter to the wavelength of the reference laser;
    - turning on the hybrid laser;
    - tuning the laser ring filter to the reference ring filter; and
    - adjusting the phase tuner to align a lasing cavity mode of the hybrid laser with the tuned laser ring filter.

* * * * *

UNITED STATES PATENT AND TRADEMARK OFFICE
CERTIFICATE OF CORRECTION

PATENT NO. : 9,882,349 B1
APPLICATION NO. : 15/404437
DATED : January 30, 2018
INVENTOR(S) : Ashok V. Krishnamoorthy, Jin-Hyoung Lee and Xuezhe Zheng It is certified that error appears in the above-identified patent and that said Letters Patent is hereby corrected as shown below:

In the Claims (Column 9, Claim 5, Line 54), please delete, "athermal laser", and replace with --method--

(Column 10, Claim 15, Line 56), please delete, "athermal laser", and replace with --hybrid laser--

Signed and Sealed this
Twentieth Day of November, 2018

Andrei Iancu
*Director of the United States Patent and Trademark Office*